United States Patent
Wiatrowski et al.

(10) Patent No.: US 8,358,551 B2
(45) Date of Patent: Jan. 22, 2013

(54) REDUCING PEAK CURRENTS REQUIRED FOR PRECHARGING DATA LINES IN MEMORY DEVICES

(75) Inventors: Jacek Wiatrowski, Austin, TX (US); Martin Jay Kinkade, Austin, TX (US); Yew Keong Chong, New Braunfels, TX (US)

(73) Assignee: ARM Limited, Cambridge (GB)

( * ) Notice: Subject to any disclaimer, the term of this patent is extended or adjusted under 35 U.S.C. 154(b) by 183 days.

(21) Appl. No.: 12/926,965

(22) Filed: Dec. 20, 2010

(65) Prior Publication Data
US 2011/0158021 A1    Jun. 30, 2011

Related U.S. Application Data

(60) Provisional application No. 61/288,565, filed on Dec. 21, 2009.

(51) Int. Cl.
*G11C 7/00* (2006.01)
(52) U.S. Cl. .......................... 365/203; 365/194; 365/226
(58) Field of Classification Search .................. 365/203, 365/194, 226, 227
See application file for complete search history.

(56) References Cited

U.S. PATENT DOCUMENTS

| | | | | |
|---|---|---|---|---|
| 6,795,361 | B2 * | 9/2004 | Joo | 365/222 |
| 7,304,910 | B1 * | 12/2007 | Hanzawa et al. | 365/233.18 |
| 7,327,630 | B2 * | 2/2008 | Park | 365/226 |
| 7,489,588 | B2 * | 2/2009 | Hanzawa et al. | 365/233.18 |

* cited by examiner

*Primary Examiner* — Son Dinh
(74) *Attorney, Agent, or Firm* — Nixon & Vanderhye P.C.

(57) ABSTRACT

A semiconductor memory storage device is disclosed. The semiconductor memory storage devices comprises: a plurality of data storage cells arranged in an array. The array comprises a plurality of columns and a plurality of rows, each column comprising at least one output line for outputting a data value from a data storage cell in a selected row of the column. Precharge circuitry for precharging the output lines to a predetermined voltage, the precharge circuitry comprising a plurality of switching devices corresponding to the plurality of columns each switching device controlled by a data output request signal and a power mode signal. The plurality of switching devices each comprising at least two switches, the at least two switches comprising a data output switch controlled by the data output request signal and a power switch controlled by the power mode signal, the plurality of switching devices connecting the output lines to the predetermined voltage in response to both the power mode signal indicating an operational mode and the data output request signal indicating data is to be output; wherein the power mode switch is configured to have a higher capacitance than the data output switch.

15 Claims, 5 Drawing Sheets

| bank2 | WL | bank3 |
| --- | --- | --- |
| cmuxsa | timer | cmuxsa |
| bank0 | WL | bank1 |

FIG. 3

REDUCING PEAK CURRENTS REQUIRED FOR PRECHARGING DATA LINES IN MEMORY DEVICES

This application claims priority to U.S. Provisional Application No. 61/288,565, filed Dec. 21, 2009, the entire contents of which are hereby incorporated by reference.

BACKGROUND OF THE INVENTION

1. Field of the Invention

The field of the invention relates to semiconductor memory storage devices.

2. Description of the Prior Art

Semiconductor memory storage devices for storing data such as SRAM are known. There are ever increasing demands to reduce the power consumption, peak currents and area of these devices.

One key way of reducing the power consumption of such SRAM devices is to reduce the bit cell leakage by disabling the bit line precharge devices that are used to precharge the bit lines for a read or write. Disabling these devices essentially floats the bitlines and the bitline voltages will reach a steady state value which can be close to VSS the voltage level of the low power rail.

When returning from low power mode the bitlines must be precharged back to the full high power VDD level before beginning normal memory access operations. The precharge of all bitlines simultaneously for a large memory can lead to a very high peak current, which can collapse the power supply rail and potentially damage the silicon. If these peak currents are significantly higher than other currents that flow during normal operation then these currents will constrain the design of the memory that needs to take account of peak current requirements.

It is known to use active devices such as inverter chains to add a delay to a control signal for triggering this precharge in order to reduce the peak currents that occur if all of the bitlines of the memory are precharged together. The delay provided by these active devices varies with operating conditions. This means that in order to allow for different process corners and not generate peak currents beyond those allowed for in the design of the memory these delay devices are configured to provide a higher average delay than is generally required during normal operation in order to avoid failure at the process corners.

It would be desirable to provide a semiconductor memory with low power leakage and with reduced peak currents on return from low power mode.

SUMMARY OF THE INVENTION

According to a first aspect the present invention there is provided a semiconductor memory storage device comprising: a plurality of data storage cells, said plurality of data storage cells being arranged in an array; said array comprising a plurality of columns and a plurality of rows, each column comprising at least one output line for outputting a data value from a data storage cell in a selected row of said column; precharge circuitry for precharging said output lines to a predetermined voltage, said precharge circuitry comprising a plurality of switching devices corresponding to said plurality of columns each switching device controlled by a data output request signal and a power mode signal, said power mode signal being transmitted to at least some of said switching devices along a single transmission path such that said signal is sent to said at least some switching devices in series; said plurality of switching devices each comprising at least two switches, said at least two switches comprising a data output switch controlled by said data output request signal and a power switch controlled by said power mode signal, said plurality of switching devices connecting said output lines to said predetermined voltage in response to both said power mode signal indicating an operational mode and said data output request signal indicating data is to be output; wherein said power mode switch is configured to have a higher capacitance than said data output switch.

In order to reduce power leakage of semiconductor memory storage devices, the output lines may be disconnected from the predetermined voltage that powers them in power saving mode. However, when returning from power saving mode to operational mode powering up these output lines will generate a significant peak current. The present invention recognises this problem and has provided a power mode switch that is configured to have a higher capacitance than the data output switch. The present invention recognises that in order to have a high performance the memory device requires data output switches that do not have high capacitance as they need to have a fast switching speed. However, it also recognises that it may be advantageous if the power mode switch that triggers the memory entering a high power operational mode from a low power inactive state has a high capacitance and does not switch so fast. If such a switch is used in a case where the power mode signal is transmitted in series to at least some of the switching devices, the delay in powering up these slow switching devices will ripple through the switching devices located along the transmission path. Thus, there will be an increasing delay in their powering up and the peak current required by each will be delayed with respect to each other. Thus, the precharge current requirements will be spread over time and the peak will be significantly lower. Furthermore, by generating this delay using a high capacitance switch, the delay does not vary greatly with the operating conditions of the device and as such the average delay required does not have to be increased to cope with process corners. This is in contrast to cases where active devices are used to generate a delay.

In summary all semiconductor devices need to be designed to cope with the highest peak current and this requirement leads to increases in the size of connecting wires and power grids. Thus, reducing the peak current is advantageous. Furthermore, in the current case this is done without unduly affecting the performance of the memory device as it is only the switching from inactive state to operational state that is delayed by these slower switches and not the switching that is performed during data output in general that is delayed.

In some embodiments, said device further comprises a driving device located between said first set and said second set of switching devices for amplifying said power mode signal.

The two sets of switching devices may be arranged in a number of ways, but in some embodiments they comprise driving devices located between them such that the control signal that has been delayed through the first set of switches is amplified before being sent further to the second set.

In some embodiments, said precharge circuitry is configured in response to a power up signal indicating said semiconductor memory storage device is to enter said operational mode from a low power mode, to transmit said power mode signal indicating said operational mode along said transmission path to a first set of switching devices corresponding to a first set of output lines and then to a second set of switching devices corresponding to a second set of output lines, said precharge circuitry transmitting said power mode signal to said first set of switching devices in series with and before said second set of switching, such that said power mode signal reaches said second set of switching devices with a delay with respect to reaching said first set of switching devices, said delay comprising a delay due to transmission of said power mode signal through said first set of switching devices.

Having a high capacitance power switch can be particularly advantageous if the power mode signal indicating the memory is to enter operational mode from a low power mode is sent in series such that sets of output lines are powered on one after the other. Dividing the output lines up into sets and providing a delay in this way allows the delay to be controlled and the peak current to be significantly reduced.

In some embodiments, said delay is dependent on a capacitance of said power switches within said first set of switching devices and on a capacitance of said transmission path to said second set of output lines.

The delay of the second set of switching devices compared to the first set of switching devices powering up will be dependent on a capacitance of the power switches and also on a capacitance of the transmission path. It is particularly advantageous if the delay is caused by the capacitance of these devices. In devices of the prior art where active devices have been used to produce delays the delay that arise from these devices have been dependent upon process corners of the processing devices such as Fast Fast corners or Slow Slow corners, they also depend on the operating voltage and temperature of the circuit and thus, providing a delay that is sufficient for a fast process corner will provide a delay that is significantly too long if the device is operating in a slow process corner. Using a delay that is due to the capacitance of the switching devices and the capacitance of the transmission path provides a delay that is not nearly as dependent on operating conditions as an active delay device would be and thus, problems with the delay varying with the operational conditions of the device are much reduced.

In some embodiments, said plurality of data storage cells are each arranged in one of a plurality of arrays; said first set of output lines comprising output lines of a first array and said second set of output lines comprising output lines of a second array.

In many memory devices the data storage cells are arranged in arrays and it is advantageous in embodiments of the invention if one array is powered up before another array. Arrays are often controlled together and thus, peak currents that flow during normal operation are dependent on the size of the array. Thus, controlling the power up of each array in turn, will mean that the size of array will have the same effect on the peak current requirements during power up as it does on the peak current requirements during normal operation.

In some embodiments, said precharge circuitry is configured to transmit a power mode signal for precharging said plurality of output lines along a transmission path to said plurality of arrays in series, such that said power mode signal is sent to a first array and then to a second array and then to at least one further array, said power mode signal reaching said at least one further array with a delay dependent upon a time taken to transmit said power mode signal through earlier arrays on said transmission path.

It may be that the memory device has a number of arrays and in which case the power mode signal is sent through each of the arrays in series such that the delay for the power mode signal reaching each array is dependent upon the time taken to transmit it through any earlier arrays on the transmission path.

In some embodiments, said transmission path from one array to another array is configured to comprise an increased capacitance with respect to a transmission path from one storage cell to another in order to increase a delay in said power mode signal's transmission.

Providing an increased capacitance of the power switch is one way of increasing delay of a signal sent in series between the different storage cells, however a further way can be to increase the capacitance of the transmission path between arrays. This is a convenient way of controlling the delay as this path does not pass through the arrays but through control circuitry associated with the arrays and thus, increasing the area required for this circuitry can be done without affecting the size of the arrays themselves.

In some embodiments, each of said data storage cells comprises a pair of output lines, a first data value being output in response to a first of said pair of output lines being discharged and a second data value being output in response to a second of said output lines being discharged; and said plurality of arrays are arranged as pairs of arrays, a data output request being made to each array in a pair of arrays at a same time, such that a same row of each pair of arrays is accessed in response to said data output request.

Many semiconductor memory devices have a pair of complementary output lines such that a voltage difference between the output lines is measured to determine what value is stored in these storage arrays. Furthermore, these arrays may be arranged as pairs of arrays such that when a data access signal indicating a row to be accessed is sent it is sent to the pair of arrays from a central position within the arrays such that the signal does not have as far to travel as if it travelled through a single array that was twice the size. This means that when outputting a data value from such a setup as only one of each pair of complementary output lines is discharged, the peak current in response to a data output signal is the current of discharging half of the output lines of two arrays.

Embodiments of the present invention are arranged to precharge output lines of each array with a delay compared to the other arrays and this means that the peak current required to charge the output lines is similar to the peak current required to discharge the output lines that occurs in response to a read request sent to a pair of arrays. Thus, the memory device will have been sized to allow for this discharge current and as the current requirements for charging of the output lines on powering up will be similar no increase in the size of the power grid or any connecting power lines will be required.

In some embodiments, the memory device is an SRAM memory device.

An SRAM device is a device that has a word line for controlling access to a particular row of the array and has a bit line and a complementary bit line as the pair of output lines. Embodiments of the present invention are particularly suitable for such a memory array as generally these memory devices are arranged as pairs of arrays with the word line drivers located in the centre and with half the bit lines in each array being discharged for any one read.

A second aspect of the present invention provides a semiconductor memory storage device comprising: a plurality of data storage cells, said plurality of data storage cells being arranged in at least two arrays; each of said at least two arrays comprising a plurality of columns and a plurality of rows, each column comprising at least one output line for outputting a data value from a data storage cell in a selected row of said column; precharge circuitry for precharging said output lines to a predetermined voltage in response to a power mode signal indicating said semiconductor memory device is switching from a low power mode to an operational mode by connecting said output lines to a predetermined voltage; wherein said precharge circuitry is configured to transmit said power mode signal indicating said operational mode along a transmission path to a first of said at least two arrays, through said first array and then to a second of said at least two arrays, said precharge circuitry transmitting said power mode signal to said first array in series with and before said second array, such that said power mode signal reaches said second array with a delay with respect to reaching said first array, said delay comprising a delay due to transmission of said power mode signal along said transmission path.

As noted previously with many memories are arranged as arrays of storage cells. When powering up the output lines of such arrays it may be advantageous to delay the charging of one array with respect to another, such that the peak currents required are reduced. Using a transmission delay as the delay means that this delay is not due to active devices and as such does not vary greatly with operating process corners.

In some embodiments said device is configured such that an average value of said delay is sufficient for at least half of said output lines of said first array to be precharged before said power mode signal reaches said second array.

Controlling the delay to limit the peak current may be done so that half of an array is powered up before the next array starts to be powered up. This means that at any one time two whole arrays will not be requiring charging current at the same time. This limits the precharge current required for a set of arrays to be similar to that required for a single array. As memories are often accessed by array limiting the current in this way is in line with operational current requirements of the memory and means that peak precharge currents do not govern the size of power grids and power lines.

A third aspect of the present invention provides a method of controlling the powering up of output lines in a semiconductor memory storage device, said semiconductor memory storage device comprising: a plurality of data storage cells, said plurality of data storage cells being arranged in at least two arrays; each of said at least two arrays comprising a plurality of columns and a plurality of rows, each column comprising at least one output line for outputting a data value from a data storage cell in a selected row of said column; precharge circuitry for precharging said output lines to a predetermined voltage; said method comprising the steps of: in response to a power mode signal indicating said semiconductor memory device is switching from a low power mode to an operational mode; transmitting said power mode signal indicating said operational mode along a transmission path to a first of said at least two arrays, through said first array and then to a second of said at least two arrays, such that said power mode signal reaches said second array with a delay with respect to reaching said first array, said delay comprising a delay due to transmission of said power mode signal along said transmission path; in response to receipt of said power mode signal at each column within said arrays connecting said at least one output line of said column to a predetermined voltage.

The above, and other objects, features and advantages of this invention will be apparent from the following detailed description of illustrative embodiments which is to be read in connection with the accompanying drawings.

BRIEF DESCRIPTION OF THE DRAWINGS

FIG. 3 schematically shows four arrays of a memory storage device;

DESCRIPTION OF THE PREFERRED EMBODIMENTS

Figure 1:
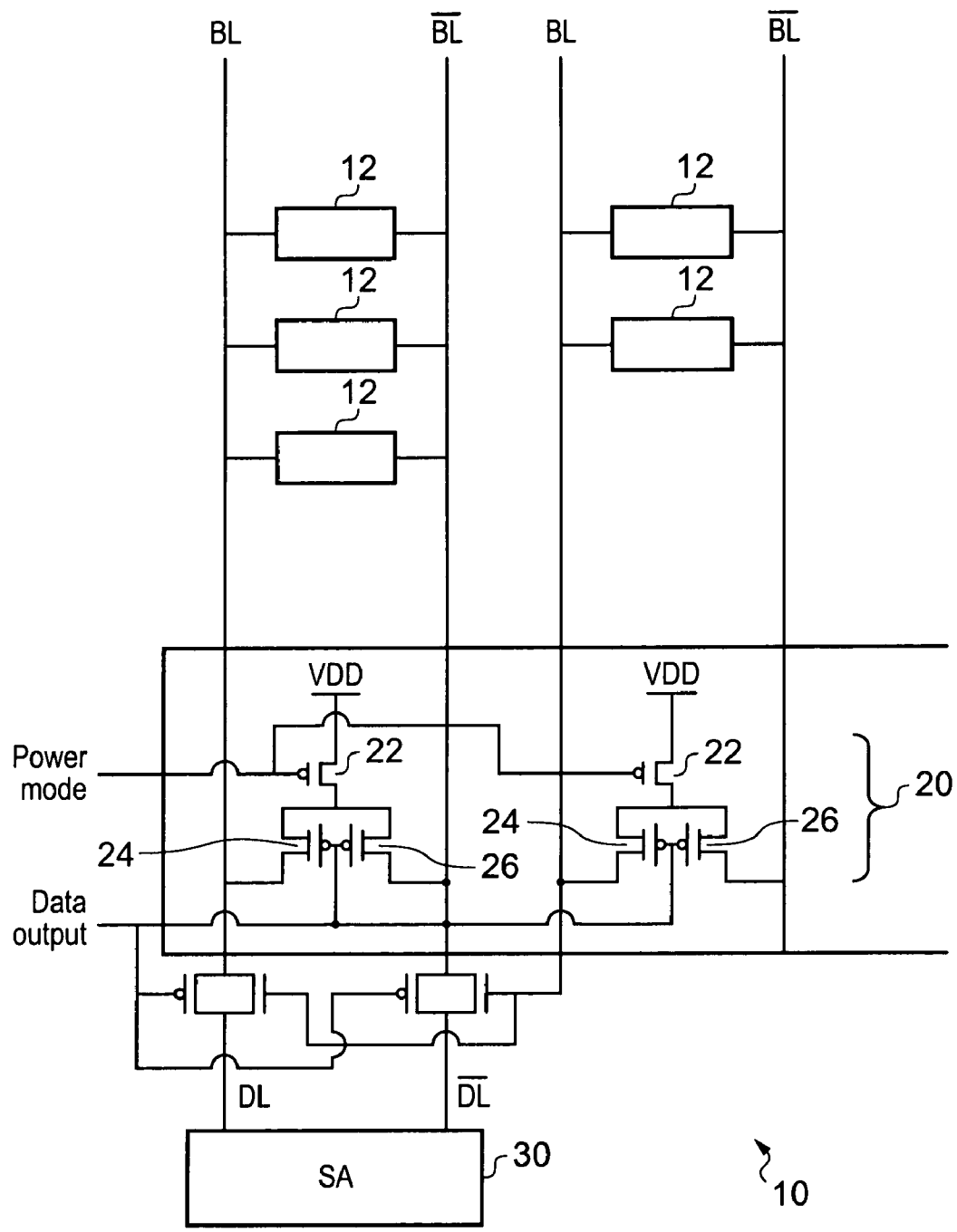
FIG. 1 shows a portion of a semiconductor memory storage device with precharge control circuitry according to an embodiment of the present invention.

FIG. 1 shows a portion of a memory according to an embodiment of the present invention. Memory 10 has a plurality of data storage cells 12 each configured to store a single data item. Each storage cell 12 within a column of these data storage cells is connected to a bit line and a complementary bit line and each cell 12 within a row of these cells is connected to a word line. The word line controls data access to the cells, while the bit line and complementary bit line output the data value stored. The word line is not shown in this diagram.

The powering of the bit lines is controlled by precharge circuitry 20. This precharge circuitry has control signals input to it which are the power mode control signal and the data output control signal.

The power mode signal is used to indicate whether the memory 10 is to enter a low power inactive mode or whether it is to enter a higher power operational mode. When a low power mode is indicated the precharge circuitry 20 isolates the bit lines from the power rails such that they are allowed to float. This floating state is achieved by the power mode signal turning the power switch 22 of each of the columns of the memory array off. Turning this switch off isolates the bit lines from the high power line VDD.

The precharge circuitry 20 also contains switching devices 24 and 26 which are data output switches and are used to couple the bit line and the complementary bit line to VDD in response to a read request. When in operational mode a read or data output request is received on the word line then initially both bit lines are connected to VDD and are therefore charged. Following receipt of the read request the row of storage cells 12 controlled by the word line on which the request was received are connected to the bit and complementary bit lines and depending on the value stored, one of the bit line or the complementary bit line are discharged. The sense amplifier 30 detects which of the bit line or complementary bit line is discharged and therefore the value of the data item stored in the data storage cell 12.

In the case of a SRAM memory array each of the data storage cells 12 in an array are connected to the bit lines via switching devices which are turned on in response to the word line for that row being activated. Thus, a signal indicating a particular row of cells needs to accessed will connect all of the storage cells of that row to the bit lines and complimentary bit lines and depending on the value stored one of the precharged bit line or complementary bit line will be discharged by the value stored in the data storage cell. If a 1 is stored in the data storage cell then the bit line is left precharged and the complementary bit line is discharged. While if a zero is stored in the storage cell 12 then it is the bit line that is discharged. Sense amplifier 30 only needs to determine a difference in voltage levels between the bit line and the complementary bit line and thus, one of them discharging slightly can be detected and a suitable value output.

Although not clear from the Figure the switching devices are configured such that the power mode switching devices 22 have a high capacitance compared to the data output switching devices 24 and 26. This means that the power mode switching devices switch more slowly than the output switching devices. The output switching devices need to switch fast as they are on an operational path and their switching speed affects the data access speed of the memory. The power mode switches by contrast only affect the speed with which the memory can be powered up following an inactive state. Using switches with a high capacitance that are arranged in series with each other, means that the delay in switching each device will trickle through along the switching path and will result in the current requirements required to charge up each bitline to VDD occurring over a reasonable time length which will decrease the peak current requirement associated with this charging.

Figure 2:
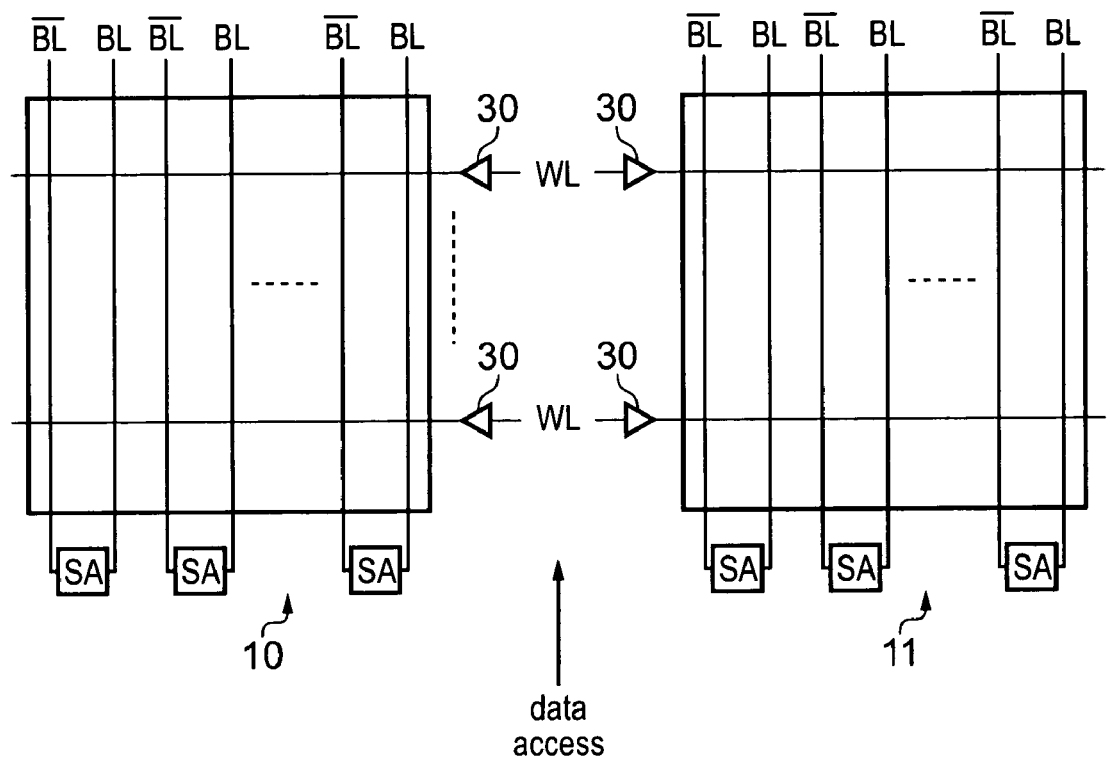
FIG. 2 shows schematically a pair of arrays of a semiconductor memory storage device.

FIG. 2 shows two arrays 10, 11 or banks of data storage cells arranged as a pair of arrays. Each of the arrays 10 and 11 are controlled by the same word line and thus, a word line request indicating that a particular row is to be accessed will trigger word line drivers 30 for that row to be driven and the same row of each array 10 and 11 will be driven high and data storage cells on that row will be connected to their respective bitlines and complementary bitlines. Arranging a memory in two arrays with word line drivers between them means that the length of the word line is halved when compared to a single array of the same size. Thus, the driving requirements of the word line driver are correspondingly reduced.

As a read request results in either of the bitline or the complementary bitline being discharged a read request will result in a discharge current for half of the bitlines of the two arrays. Thus, these arrays need to be designed with at least this peak current requirement in mind. If the peak current requirement on returning to active from inactive mode can be sized to be similar to this requirement then the memory power design will be constrained by normal operational requirements. Thus, a power up system with delays such that each array is powered up in turn would require the bitlines and complementary bilines of an array to be charged together which would be a similar current requirement to half of the bitlines of two arrays being discharged at any one time in response to a read request.

FIG. 3 shows schematically an example of a four bank memory. For this memory, the word line drivers WL drive left and right across bank 0/1 and bank 2/3. For a given read cycle a single word line will be asserted which will in the worst case lead to a full discharge of half the bit lines in bank 0 and bank 1 or half the bit lines in bank 2 and bank 3.

Thus, the peak current for a read cycle will be equivalent to discharging all of the bit lines in the bank. To match this peak current during charging, embodiments of the present invention will arrange the bit line precharge when returning from the low power floating bit line state such that precharge occurs for a single bank at any one time. Thus, bit line precharge will occur for bank 0 followed by bank 1, followed by bank 2 and finally bank 3.

Thus, this invention strives to match the peak current when precharging all of the bit lines to the normal read write bit line precharge peak current. This allows the end user to design the power supply for the peak current of the normal read write operation without negative effects when returning from a low power mode.

Figure 4:
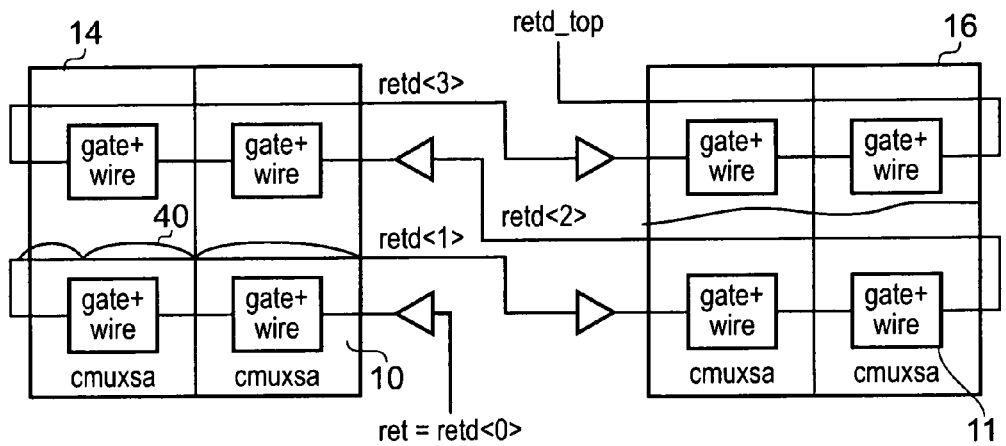
FIG. 4 schematically shows a transmission path for a power up signal for several memory banks according to an embodiment of the present invention.

FIG. 4 shows schematically how this power mode signal is delayed through the various arrays in an embodiment of the present invention. The power mode signal ret is generated from the control section of the memory and indicates entry and exit from the power saving mode. When ret=1 the bit line precharge is disabled and when ret transitions from 1 to 0 the bit line precharge is enabled.

The ret signal travels through each column of an array switching the PMOS header device 22 on for each column. The signal is then routed back along circuitry arranged between the arrays and travels back to the timer cell in the centre of the array shown in FIG. 3. The signal is delayed by the gates and wires it travels through in each array and also by the return path shown schematically as 40 in this Figure. This return path can be configured to generate a desired delay in addition to the delay occurring through the array and in this way cause one array to power up its bit lines before a next array thereby controlling a peak current required for charging the bit lines to a value that is similar to a peak current required during read and write to arrays. Thus, the ret<0> signal used to power up the first array 10 and is then used to generate a ret<1> signal for powering up the second array 11 which in turn is used to generate a ret <2> signal for powering the third array 14 which is used to generate a ret<3> signal for powering up the fourth array 16. The ret <3> signal is then used to generate a ret top signal which is used for all memory instances that have more than 4 banks.

Figure 5:
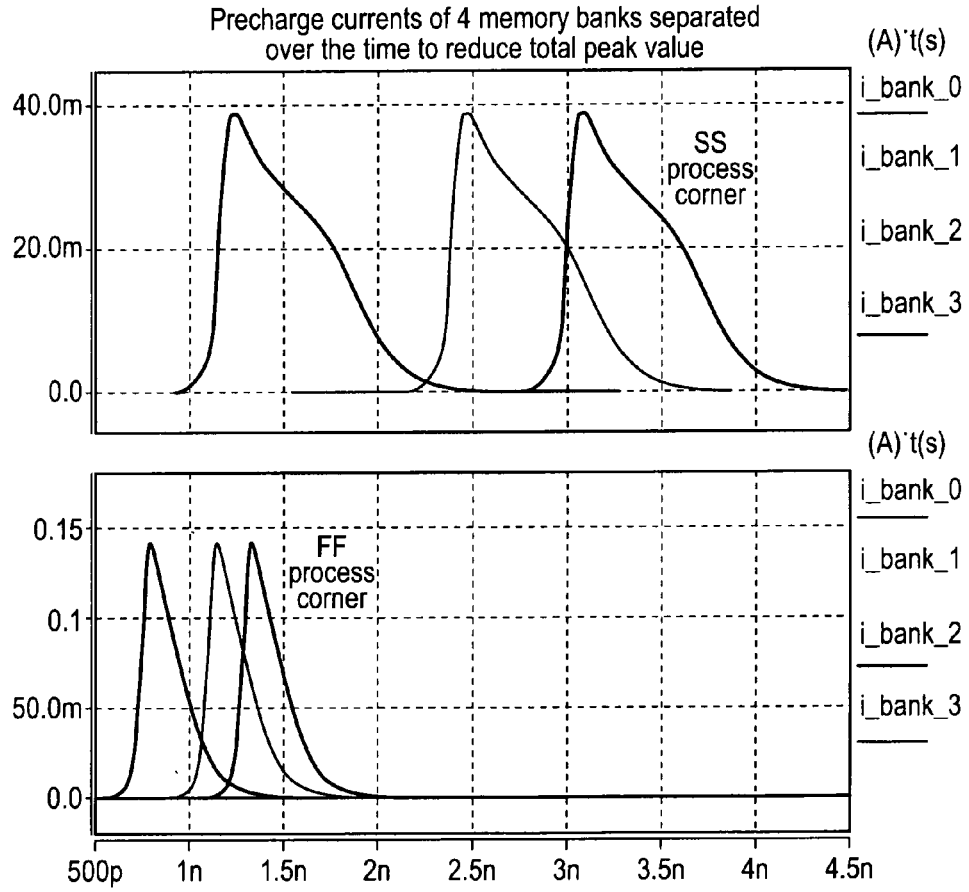
FIG. 5 shows simulated values of precharge currents at process corners of a semiconductor memory according to an embodiment of the present invention.

When determining peak currents that occur during precharge the different process corners of the system need to be looked at. FIG. 5 shows simulated values of the precharge currents for a Fast Fast (FF) process corner and a Slow Slow (SS) process corner. The FF corner is due to high voltage operation and at this corner gate delay is very small compared to wire delay. Thus, any delay scheme that was based on active logic gate delay elements would not provide adequate delay without a large number of these stages. This scheme by contrast provides a good delay at the FF corner due to the wire and gate loading. In addition, this scheme is scalable with increasing delays as a size of the memory increases.

The simulated results of FIG. 5 show separated peaks of currents of 4 memory banks in the SS and FF process corners. If no delay scheme is used all 4 peaks would occur at the same time resulting in 4 times the peak current. It should be noted that there is some overlap of peak currents in the FF process corner. This overlap could be reduced by further increasing the delay, however this would provide an additional penalty of increasing the time requirement to return to normal operation following the low leakage on low power mode.

Figure 6:
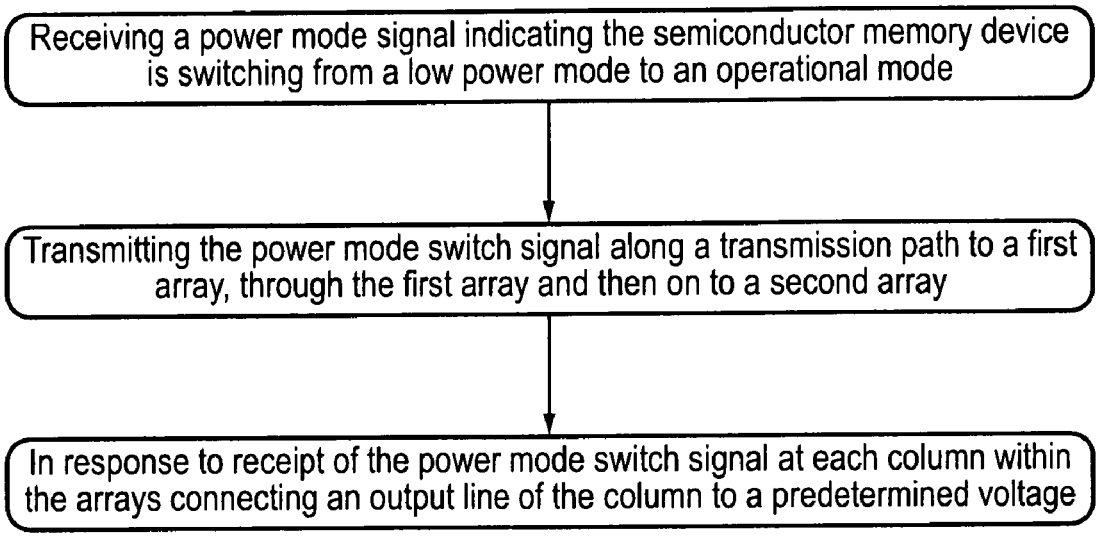
FIG. 6 shows a flow diagram illustrating steps in a method for switching from low power to operational mode.

FIG. 6 shows a flow diagram illustrating a method of powering up a memory device according to an embodiment of the present invention. Initially a power mode signal is received indicating the semiconductor memory device is switching from a low power mode to an operational mode. This power mode signal is transmitted along a transmission path to a first array and then through the first array to a second array. In response to the power mode switch at each column the output lines are charged up. Due to the delays experienced by the signal travelling though the first array the second array is switched on later than the first array thereby reducing peak current requirements.

Although the method is only described for two arrays the power mode signal could proceed on through further arrays depending on the number of arrays. As described earlier the delay encountered by the power mode signal depends on the capacitance of the switching devices and the wires of the memory. These can be configured to provide suitable delays depending on the peak current requirements.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A semiconductor memory storage device comprising:
   a plurality of data storage cells, said plurality of data storage cells being arranged in an array;
   said array comprising a plurality of columns and a plurality of rows, each column comprising at least one output line for outputting a data value from a data storage cell in a selected row of said column;
   precharge circuitry for precharging said output lines to a predetermined voltage, said precharge circuitry comprising a plurality of switching devices corresponding to said plurality of columns each switching device controlled by a data output request signal and a power mode signal, said power mode signal being transmitted to at least some of said switching devices along a single transmission path such that said signal is sent to said at least some switching devices in series;
   said plurality of switching devices each comprising at least two switches, said at least two switches comprising a data output switch controlled by said data output request signal and a power mode switch controlled by said power mode signal, said plurality of switching devices connecting said output lines to said predetermined voltage in response to both said power mode signal indicating an operational mode and said data output request signal indicating data is to be output; wherein
   said power mode switch is configured to have a higher capacitance than said data output switch.

2. A semiconductor memory storage device according to claim 1, wherein
   said precharge circuitry is configured in response to a power up signal indicating said semiconductor memory storage device is to enter said operational mode from a low power mode, to transmit said power mode signal indicating said operational mode along said transmission path to a first set of switching devices corresponding to a first set of output lines and then to a second set of switching devices corresponding to a second set of output lines, said precharge circuitry transmitting said power mode signal to said first set of switching devices in series with and before said second set of switching, such that said power mode signal reaches said second set of switching devices with a delay with respect to reaching said first set of switching devices, said delay comprising a delay due to transmission of said power mode signal through said first set of switching devices.

3. A semiconductor memory storage device according to claim 2, said device further comprising a driving device located between said first set and said second set of switching devices for amplifying said power mode signal.

4. A semiconductor memory storage device according to claim 2, wherein said delay is dependent on a capacitance of said power switches within said first set of switching devices and on a capacitance of said transmission path to said second set of output lines.

5. A semiconductor memory device according to claim 2, wherein said plurality of data storage cells are each arranged in one of a plurality of arrays;
   said first set of output lines comprising output lines of a first array and said second set of output lines comprising output lines of a second array.

6. A semiconductor memory device according to claim 5, said precharge circuitry being configured to transmit a power mode signal for precharging said plurality of output lines along a transmission path to said plurality of arrays in series, such that said power mode signal is sent to a first array and then to a second array and then to at least one further array, said power mode signal reaching said at least one further array with a delay dependent upon a time taken to transmit said power mode signal through earlier arrays on said transmission path.

7. A semiconductor memory device according to claim 6, wherein said transmission path from one array to another array is configured to comprise an increased capacitance with respect to a transmission path from one storage cell to another in order to increase a delay in said power mode signal's transmission.

8. A semiconductor memory device according to claim 6, wherein each of said data storage cells comprises a pair of output lines, a first data value being output in response to a first of said pair of output lines being discharged and a second data value being output in response to a second of said output lines being discharged; and
   said plurality of arrays are arranged as pairs of arrays, a data output request being made to each array in a pair of arrays at a same time, such that a same row of each pair of arrays is accessed in response to said data output request.

9. A semiconductor memory device according to claim 1, wherein said semiconductor memory device comprises an SRAM memory.

10. A semiconductor memory storage device comprising:
    a plurality of data storage cells, said plurality of data storage cells being arranged in at least two arrays;
    each of said at least two arrays comprising a plurality of columns and a plurality of, rows, each column comprising at least one output line for outputting a data value from a data storage cell in a selected row of said column;
    precharge circuitry for precharging said output lines to a predetermined voltage in response to a power mode signal indicating said semiconductor memory device is switching from a low power mode to an operational mode by connecting said output lines to a predetermined voltage; wherein
    said precharge circuitry is configured to transmit said power mode signal indicating said operational mode along a transmission path to a first of said at least two arrays, through said first array and then to a second of said at least two arrays, said precharge circuitry transmitting said power mode signal to said first array in series with and before said second array, such that said power mode signal reaches said second array with a delay with respect to reaching said first array, said delay comprising a delay due to transmission of said power mode signal along said transmission path.

11. A semiconductor memory storage device according to claim 10, wherein said precharge circuitry comprises a plurality of switching devices corresponding to said plurality of columns said transmission path passing to each of said plurality of switching devices in said first array and then along a path to said second array, said delay being dependent on a capacitance of said plurality of switching devices within said first array and on a capacitance of said transmission path.

12. A semiconductor memory storage device according to claim 11, wherein said device is configured such that an average value of said delay is sufficient for at least half of said output lines of said first array to be precharged before said power mode signal reaches said second array.

13. A semiconductor memory device according to claim 10, said memory device comprising a plurality of arrays, said precharge circuitry being configured to transmit a power mode signal for precharging said plurality of output lines along a transmission path to said plurality of arrays in series, such that said power mode signal is sent to a first array and then to a second array and then to at least one further array, said power mode signal reaching said at least one further array with a delay dependent upon a time taken to transmit said power mode signal through earlier arrays on said transmission path.

14. A semiconductor memory device according to claim 12, wherein said at least two arrays are arranged as at least one pair of arrays with data access circuitry located between each of said at least one pair of arrays, such that a same row of each pair of arrays is accessed in response to a same data output request; and each of said data storage cells comprises a pair of output lines, a first data value being output in response to a first of said pair of output lines being discharged and a second data value being output in response to a second of said output lines being discharged.

15. A method of controlling the powering up of output lines in a semiconductor memory storage device, said semiconductor memory storage device comprising:

a plurality of data storage cells, said plurality of data storage cells being arranged in at least two arrays;

each of said at least two arrays comprising a plurality of columns and a plurality of rows, each column comprising at least one output line for outputting a data value from a data storage cell in a selected row of said column;

precharge circuitry for precharging said output lines to a predetermined voltage; said method comprising the steps of:

in response to a power mode signal indicating said semiconductor memory device is switching from a low power mode to an operational mode;

transmitting said power mode signal indicating said operational mode along a transmission path to a first of said at least two arrays, through said first array and then to a second of said at least two arrays, such that said power mode signal reaches said second array with a delay with respect to reaching said first array, said delay comprising a delay due to transmission of said power mode signal along said transmission path;

in response to receipt of said power mode signal at each column within said arrays connecting said at least one output line of said column to a predetermined voltage.

* * * * *